United States Patent
McHugh et al.

[19]

[11] Patent Number: 6,159,032
[45] Date of Patent: Dec. 12, 2000

[54] LOW PROFILE SOCKET

[75] Inventors: Robert G. McHugh, Evergreen, Colo.; Nick Lin, Hsin-Chuang, Taiwan

[73] Assignee: Hon Hai Precision Ind. Co., Ltd., Taipei Hsien, Taiwan

[21] Appl. No.: 09/256,844

[22] Filed: Feb. 24, 1999

[51] Int. Cl.⁷ .................................................. H01R 4/50
[52] U.S. Cl. ............................................................ 439/342
[58] Field of Search .................................. 439/263, 264, 439/266, 342

[56] References Cited

U.S. PATENT DOCUMENTS 5,730,615   3/1998   Lai et al. .................................. 439/342
6,004,141  12/1999   Abe et al. .................................. 439/73
6,004,152  12/1999   Walkup et al. ........................... 439/342
6,022,236   2/2000   McHugh et al. ......................... 439/342

Primary Examiner—Khiem Nguyen
Attorney, Agent, or Firm—Wei Te Chung

[57] ABSTRACT

A low profile socket comprises an insulative cover comprising a first rectangular plate from opposite corners of which two first wings extend. An insulative base comprises a second rectangular plate from opposite corners of which two second wings extend. Supporting walls extend downward from opposite sides of each second wings. At least one blind hole is defined from top surface of each first wing down to a portion of each supporting wall of the cover. At least one tapered tab extends from the second wing portion of the base for slidably engaging with the at least one blind hole of the first wing portion of the cover.

6 Claims, 6 Drawing Sheets

LOW PROFILE SOCKET

BACKGROUND OF THE INVENTION

1. Field of the Invention

The present invention relates to a low profile socket for electrically connecting a CPU to a printed circuit board.

2. The Prior Art

Zero insertion force (ZIF) sockets are used to connect a CPU to a printed circuit board for years. Normally, this socket needs a relatively long pitch for adopting a lead-in distance of each contact which allows a corresponding CPU pin to be inserted into the socket with substantially zero insertion force first ly a nd then moved by a cover of the socket for this lead-in distance to abut against contacting portion of the contact in the socket. These sockets may be referred to U.S. Pat. Nos. 5,057,031, 5,489,217 and 5,730,615. For effectively utilizing the space of the socket and lowering the profile thereof the inventor of the present invention has proposed a low profile socket in U.S. application Ser. No. 09/146,998 which arranges the moving direction of the cover of the socket in a diagonal line and the normal actuation mechanism including the cam and the lever being omitted for space conservation. Although this configuration works well, the complication of its structure will increase manufacturing cost. It is requisite to provide a simplified structure which can function as well as the socket of U.S. application Ser. No. 09/146,998 and achieve cost-down requirement.

SUMMARY OF THE INVENTION

The primary purpose of the present invention is to provide an improved low profile socket which has a relatively simple structure for lowering manufacturing cost.

In accordance with one aspect of the present invention, a low profile socket comprises an insulative cover comprising a first rectangular plate from opposite corners of which two first wings extend. An insulative base comprises a second rectangular plate from opposite corners of which two second wings extend. Supporting walls extend downward from opposite sides of each first wings. At least one blind hole is defined from top surface of each first wing down to a portion of each supporting wall of the cover. At least one tapered tab extends from the second wing portion of the base for slidably engaging with the at least one blind hole of the first wing portion of the cover.

DETAILED DESCRIPTION OF THE PREFERRED EMBODIMENT

Figure 1:
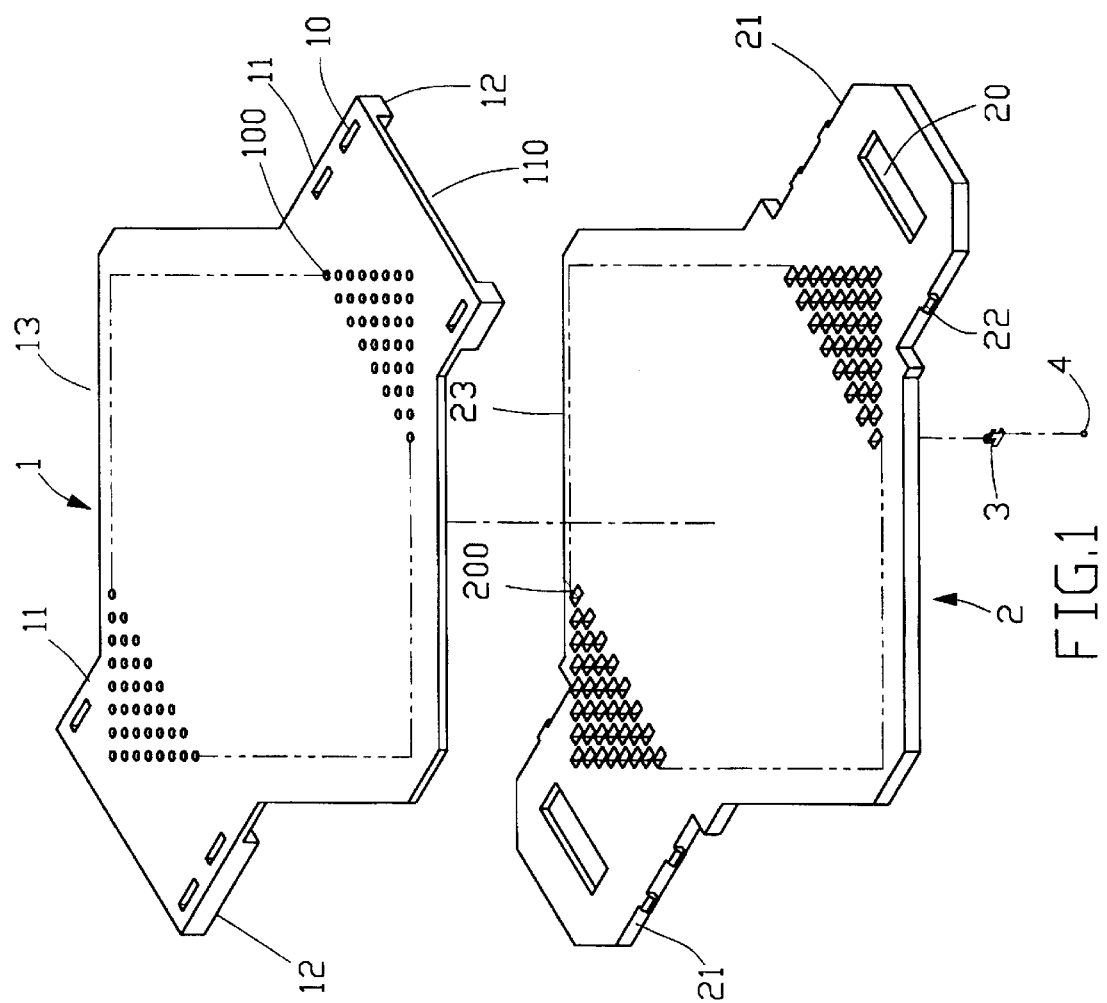
FIG. 1 is an exploded view of a low profile socket in accordance with the present invention.
Figure 4:
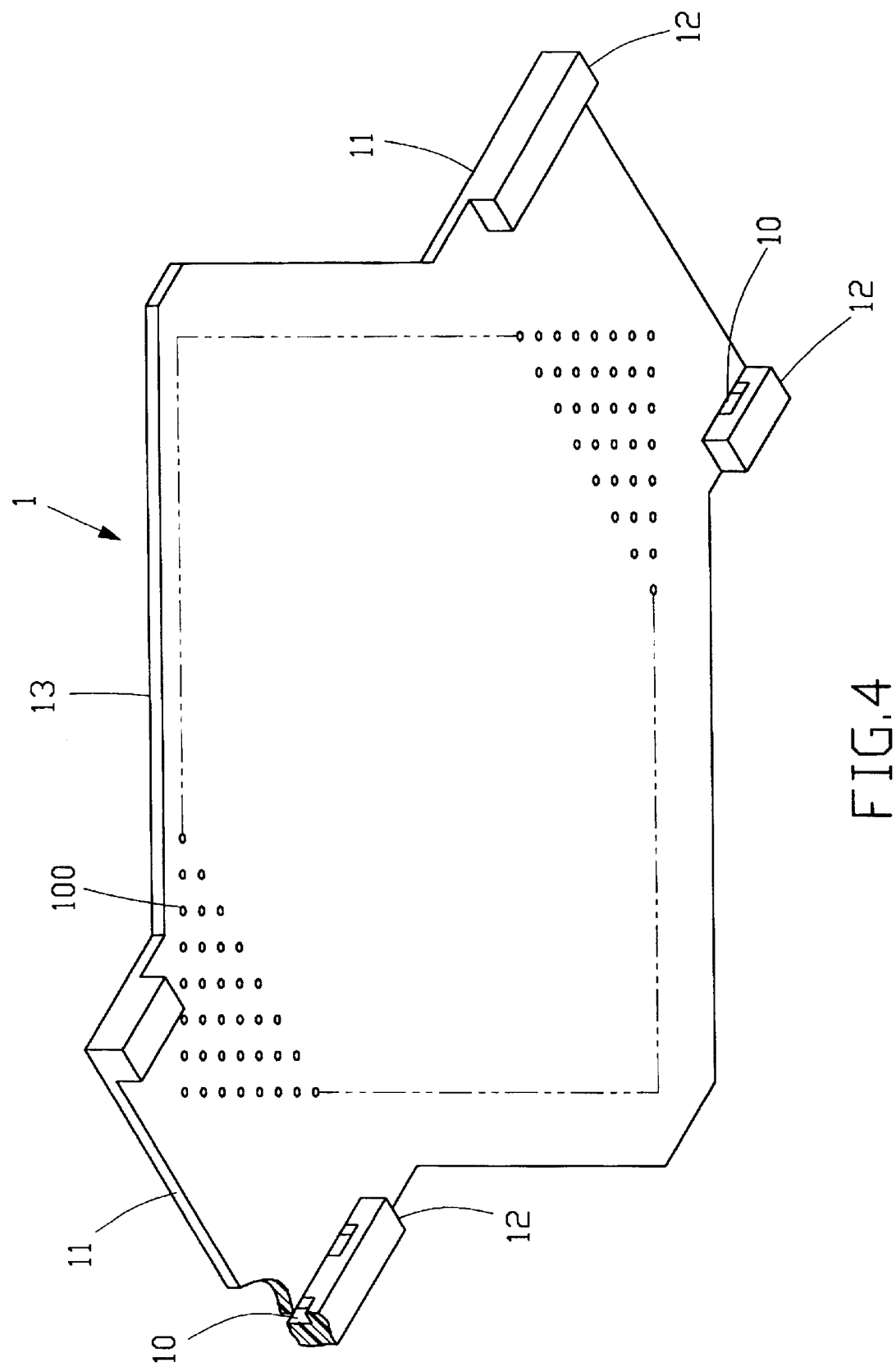
FIG. 4 is a cover of FIG. 1 taken from a different angle.

Referring to FIG. 1, a lower profile socket in accordance with the present invention comprises a cover 1 slidably attached to a base 2. The cover 1 comprises a rectangular plate 13 having two first wings 11 extending from opposite corners thereof. The cover 1 defines a plurality of conic holes 100 therein, i.e., the upper portion of each hole 100 has a greater diameter than the lower portion thereof. Supporting walls 12 extend downward from two sides of the first wing 11. Also referring to FIG. 4, blind holes 10 are defined from a top surface of the first wing 11 into a portion of the supporting wall 12. The base 2 also has a rectangular plate 23 similar to that of the cover 1 and a plurality of passageways 200 are defined in the rectangular plate 23 for respectively receiving a corresponding contact 3, wherein each passageway 200 is correspondingly in alignment with a corresponding hole 100 of the cover 1 when the cover 1 is attached to the base 2. Since the passageway 200 has greater area than that of the corresponding hole 100, the hole 100 can be maintained within the area of the passageway 200 during movement of the cover 1 with respect to the base 2. Each passageway 200 has a relatively long axis substantially parallel to a diagonal line of the second rectangular plate 23 of the base 2. A solder ball 4 is adapted to be soldered on a lower end of the contact 3. Each contact 3 are retained in the passageway 200 and the detailed structure thereof may be referred to U.S. patent application Ser. No. 09/146,998 which has the same inventor of this application and assigned to the same assignee. Two second wings 21 extend from opposite corners of the rectangular plate 23 and each second wing 21 is receivable between opposite supporting walls 12 of the first wing 11 of the cover 1. Corresponding number of tapered tabs 22 are projected from each side of the second wing 21 for matingly engaging with the blind holes 10 defined in the first wings 11 of the cover 1. Each second wing 21 defines a slot 20 and at least one of the first wings 11 has its terminal edge horizontally displaced within the range of the corresponding slot 20 of the second wing 21 after the cover 1 is assembled to the base 2 and moved with respect to the base 2.

Figure 2:
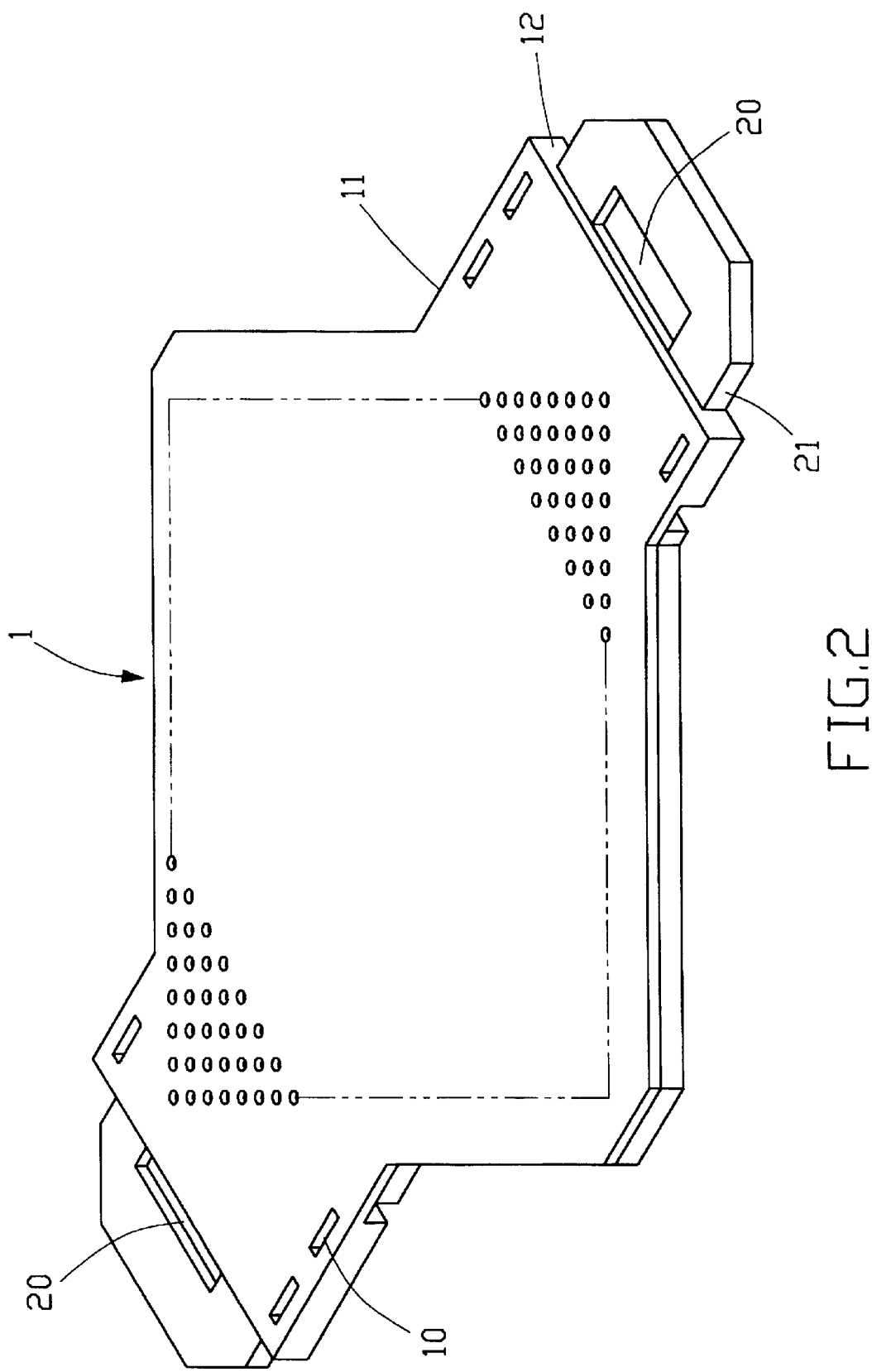
FIG. 2 an assembled view of FIG. 1 and the socket is in an open status.
Figure 5:
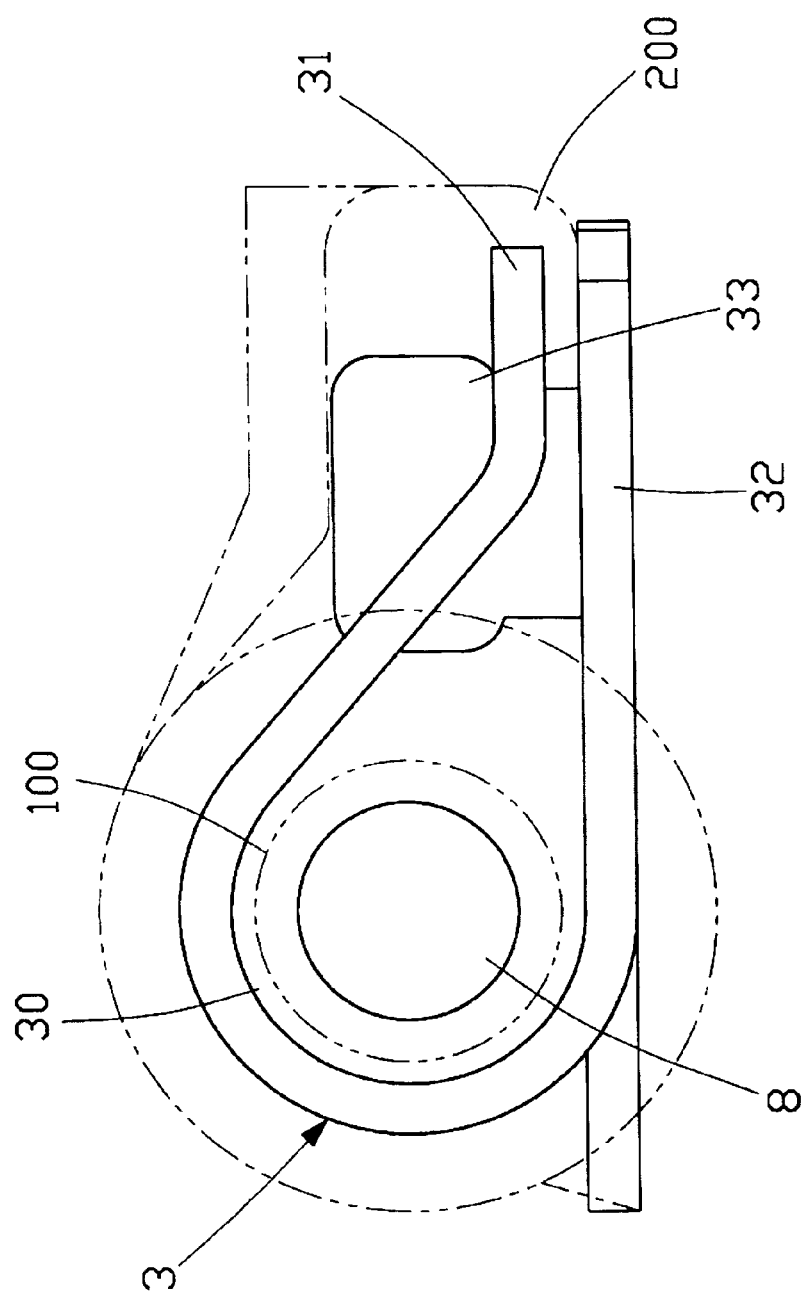
FIG. 5 is a schematic view showing the relation between a CPU pin and the contact of the socket of the present invention in the open status.

Referring to FIG. 2, the cover 1 is easily assembled to the base 2 by aligning the blind holes 10 of the cover 1 to the tabs 22 of the base 2 and exert force on the cover 1 so as to force the tabs 22 to be received in the blind holes 10. FIG. 2 shows that the socket is in an open status in which pins of a chip set (not shown) can be inserted into the socket with substantially zero insertion force. FIG. 5 shows a schematic view of an inserted pin 8 related to the contact 3 during the open status. The contact 3 basically has a curved shape including a clamping end 31 curvedly extended and connected to an engaging portion 32 which is interferentially retained in the passageway 200 thus defining a reception space 30 therebetween. A soldering pad 33 extends horizontally from a lower end of the engaging portion 32 for attachment by the solder ball 4. The pin 8 of the chip set is originally inserted into the reception space 30 with substantially zero insertion force.

Figure 3:
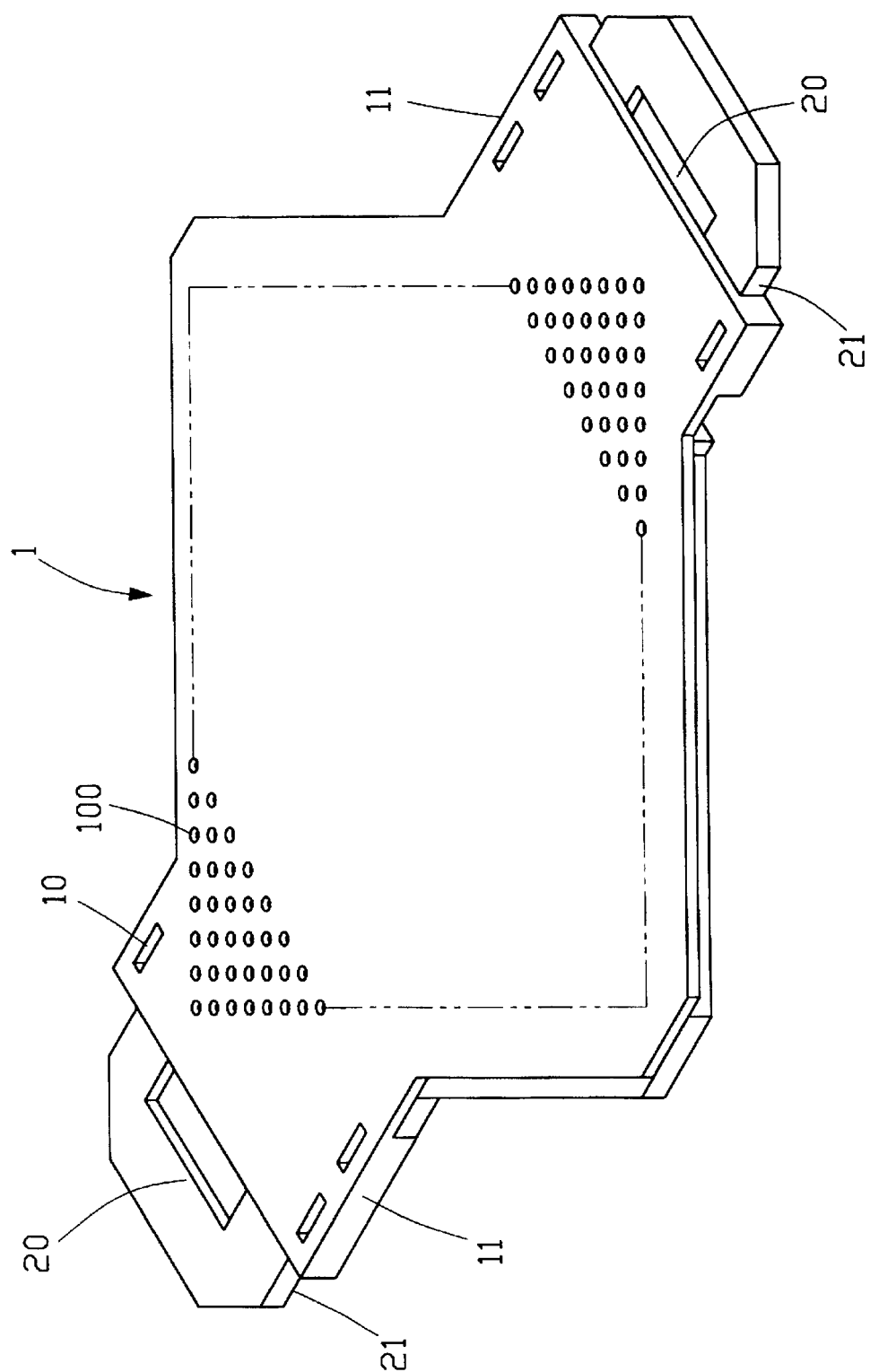
FIG. 3 is an assembled view of FIG. 1 and the socket is in a closed status.
Figure 6:
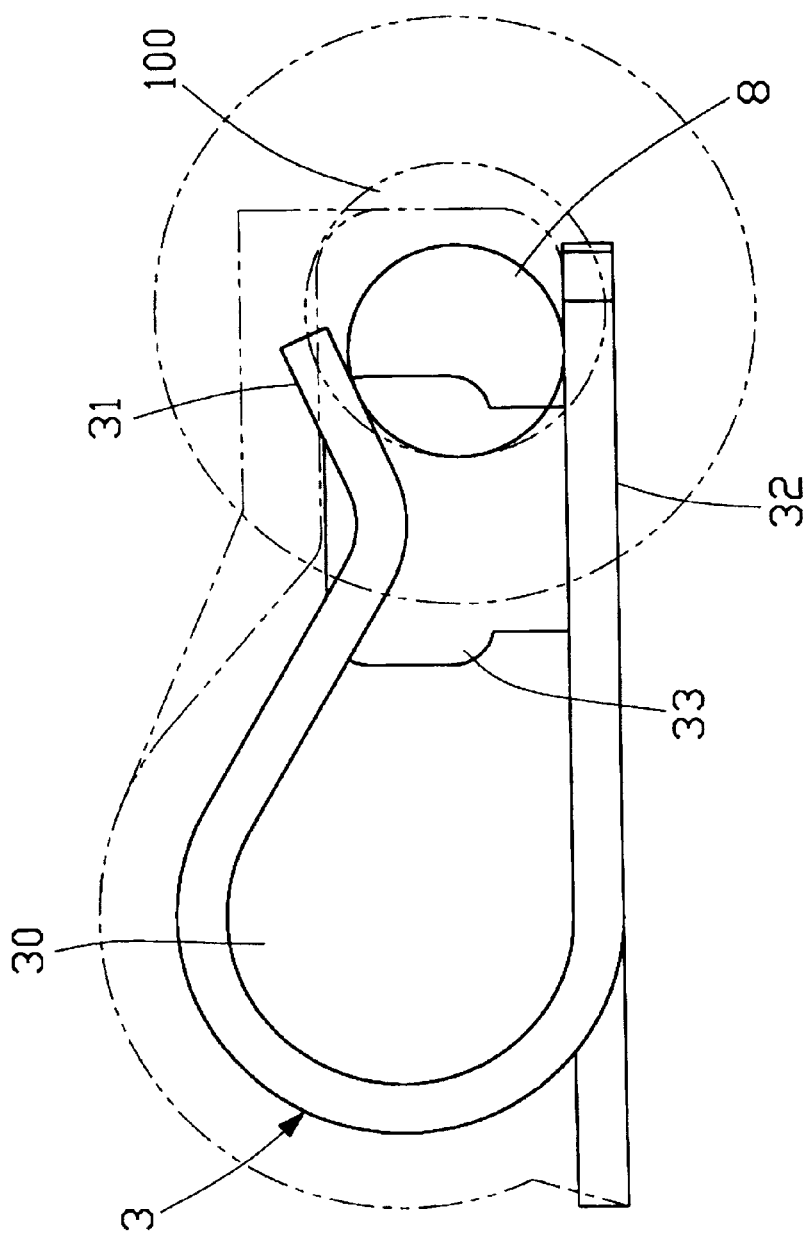
FIG. 6 is a schematic view showing the relation between a CPU pin and the contact of the socket of the present invention in the closed status.

After the pin has been inserted into the passageway 200 as shown in FIG. 5, the cover 1 may be moved by a tool such as a screw driver so as to facilitate the socket to a closed status as shown in FIGS. 3 and 6. The pin 8 is driven by inner periphery of the hole 100 of the cover 1 so as to push the pin 8 to be engaged with the clamping end 31 of the contact 3 thereby electrically connecting the pin 8 to the contact 3.

It is noted that the diagonally opposite first wings 11 of the cover 1 define the space 110 for respectively receiving the corresponding diagonally opposite second wings 21 of the base 2 therein, and the second wings 21 further extend out of the outermost edges of the corresponding first wings 11 and each of the second wings 21 defines a slot 20 whereby the cover 1 can be actuated to be moved diagonally by means that a screwdriver is inserted into the slot 20 of one of the second wings 21 and engages the outermost edge of the corresponding first wing 11 to push the cover 1 to move in an opposite direction of the corresponding second wing 21.

While the present invention has been described with reference to a specific embodiment, the description is illustrative of the invention and is not to be construed as limiting the invention. For example, the supporting wall 12 and the blind holes 10 may be formed in the base 2 while the tapered tabs 22 of the base 2 may be formed in the cover 1.

Therefore, various modifications to the present invention can be made to the preferred embodiment by those skilled in the art without departing from the true spirit and scope of the invention as defined by the appended claims.

What is claimed is:

1. A low profile socket comprising:
   an insulative cover comprising a first rectangular plate from opposite corners of which two first wings extend;
   an insulative base comprising a second rectangular plate from opposite corners of which two second wings extend, each second wing defining a slot in such a place that at least one of the first wings has an end edge thereof displaced within a range of the corresponding slot of the second wing when the cover is moved with respect to the base;
   supporting walls extending downward from opposite sides of each first wing;
   at least one blind hole defined from a top surface of each first wing down to a portion of a supporting wall of the cover; and at least one tapered tab extending from a second wing of the base for slidably engaging with the at least one blind hole of the first wing of the cover.

2. The low profile socket as claimed in claim 1 further comprising a plurality of passageways defined in the second rectangular plate for receiving corresponding number of contacts therein, wherein each passageway has a relatively long axis substantially parallel to a diagonal line of the second rectangular plate of the base.

3. A low profile socket comprising:
   an insulative cover comprising a first rectangular plate from opposite corners of which two first wings extend;
   an insulative base comprising a second rectangular plate from opposite corners of which two second wings extend, each second wing defining a slot in such a place that at least one of the first wings has an end edge thereof displaced within a range of the corresponding slot of the second wing when the cover is moved with respect to the base;
   supporting walls extending substantially perpendicularly from opposite sides of either each of the first wings or each of the second wings;
   at least one blind hole defined from a surface of the either each of the first wings or the second wings to a portion of each supporting wall; and
   at least one corresponding tapered tab extending from each side of either the second wings or the first wings, which have no supporting walls, and mating to the at least one blind hole for slidably engaging with the at least one blind hole.

4. The low profile socket as claimed in claim 3 further comprising a plurality of passageways defined in the second rectangular plate for receiving corresponding number of contacts therein, wherein each passageway has a relatively long axis substantially parallel to a diagonal line of the second rectangular plate of the base.

5. A low profile socket comprising an insulative rectangular cover and an insulative rectangular base slidably engaged with each other so that the rectangular cover is horizontally movable with respect to the rectangular base along a diagonal line of the rectangular base, the rectangular cover having two first wings extending from opposite corners thereof and supporting walls extending downward from opposite edges of the first wings and the rectangular base having two second wings extending from opposite corners thereof so that each second wing is movably received between opposite supporting walls of corresponding first wing, wherein the rectangular cover defines a plurality of holes vertically in alignment with passageways defined in the rectangular base during movement of the rectangular cover with respect to the rectangular base.

6. A low profile socket comprising:
   an insulative cover comprising a first rectangular plate with a pair of wing portions diagonally extending outward from two opposite corners thereof in opposite directions;
   an insulative base comprising a second rectangular plate with a pair of wings diagonally extending outward from two opposite corners thereof in opposite directions;
   said pair of wing portions and said pair of wings being aligned with each other in a vertical direction; wherein the wing portions define the spaces for respectively receiving the corresponding wings therein, and the wing extends out of an outermost edge of the corresponding wing portion and defines means for cooperation with a tool to actuate the corresponding wing portion and moving the cover along a diagonal direction of the socket opposite to said wing.

* * * * *